United States Patent
Peters et al.

(10) Patent No.: US 10,044,136 B1
(45) Date of Patent: Aug. 7, 2018

(54) CABLE STRAIN ARRESTOR ASSEMBLY

(71) Applicant: Keithley Instruments, LLC, Solon, OH (US)

(72) Inventors: Joseph A. Peters, Cuyahoga Falls, OH (US); Vladimir V. Genkin, Westfield, OH (US)

(73) Assignee: Keithley Instruments, LLC, Solon, OH (US)

( * ) Notice: Subject to any disclaimer, the term of this patent is extended or adjusted under 35 U.S.C. 154(b) by 0 days.

(21) Appl. No.: 15/670,989

(22) Filed: Aug. 7, 2017

Related U.S. Application Data

(60) Provisional application No. 62/485,341, filed on Apr. 13, 2017.

(51) Int. Cl.
- *H01R 13/58* (2006.01)
- *H01R 13/73* (2006.01)
- *H01R 13/62* (2006.01)

(52) U.S. Cl.
CPC ......... *H01R 13/5837* (2013.01); *H01R 13/62* (2013.01); *H01R 13/73* (2013.01)

(58) Field of Classification Search
CPC .................................................. H01R 13/5837
See application file for complete search history.

(56) References Cited

U.S. PATENT DOCUMENTS

| | | | | |
|---|---|---|---|---|
| 5,954,301 A * | 9/1999 | Joseph | ................ | H01R 9/2416 248/68.1 |
| 7,077,688 B2 * | 7/2006 | Peng | ................ | H02G 3/32 248/68.1 |
| D607,306 S * | 1/2010 | Muncy | ................ | H01R 13/5812 D8/349 |
| 8,452,151 B2 * | 5/2013 | Schroeder | ................ | H01R 13/60 174/660 |
| 9,556,972 B2 * | 1/2017 | White | ................ | H02G 3/32 |
| 2007/0104450 A1 * | 5/2007 | Phung | ................ | G02B 6/4459 385/137 |
| 2010/0086273 A1 * | 4/2010 | Rector, III | ................ | G02B 6/4459 385/135 |
| 2011/0011612 A1 * | 1/2011 | Sayres | ................ | H02G 3/045 174/50 |
| 2015/0056832 A1 * | 2/2015 | Fransen | ................ | H01R 13/518 439/153 |
| 2015/0077935 A1 * | 3/2015 | Wright | ................ | H05K 7/20181 361/695 |
| 2016/0061354 A1 * | 3/2016 | Abby | ................ | G02B 6/4457 211/85.5 |
| 2018/0035563 A1 * | 2/2018 | Chen | ................ | F16L 3/1075 |

\* cited by examiner

*Primary Examiner* — James Harvey
(74) *Attorney, Agent, or Firm* — Marger Johnson; Andrew J. Harrington

(57) ABSTRACT

A cable strain arrestor assembly that protects equipment from damage due to pulling forces on attached cables is disclosed. The assembly comprises a mounting bracket that attaches to an equipment enclosure and converts pulling forces on the cables into compressional forces on the cables in order to break the cables before any damage can be transferred further through the cables. The assembly is able to convert these pulling forces by utilizing a tapering slot and a complementary shaped clamping collar with a channel that contracts as the clamping collar is moved in the direction of the taper of the slot.

18 Claims, 10 Drawing Sheets

US 10,044,136 B1

CABLE STRAIN ARRESTOR ASSEMBLY

TECHNICAL FIELD

This disclosure is directed to cable strain relief for test and measurement devices and instrumentation, and, more particularly, to a cable strain arrestor assembly for preventing the transmission of damaging forces to instruments located in a rack cabinet due to cable strain.

BACKGROUND

Test or measurement instruments or other equipment can be stored in rack cabinets for convenience and utility. Many rack cabinets are built according to a 19 inch width standard that developed in the telecommunications industry. Back panels of these rack cabinets can provide access to instrument wiring for setting up different test scenarios, including connections to other devices, such as probes, power, and devices under testing (DUTs), for example.

Conventional instrumentation systems utilize many wires, cables, leads, and/or cords. With so many cables and excess lengths connecting to other devices, pulling at any point along the cable may travel back to the instruments and cause damage. Moreover, expensive equipment may be unmounted or even overturned, imparting further damage to other instruments and devices in the environs.

Embodiments of the invention address these and other deficiencies in conventional systems.

DETAILED DESCRIPTION

Example cable strain relief devices have included clamps, bushings, threaded inserts, screws, and friction inserts to safeguard electronic equipment, the surroundings, and the cables themselves from damage. The cable strain relief devices did not guarantee protection in many cases because the pulling force applied through the cable compromised the structural integrity of the cable strain relief device, such as bending, distorting, or breaking the devices. With the cable strain relief devices compromised, the cables were free to slip and even dismount the equipment from its foundation and/or containment. Thus, these cable strain relief devices were prone to eventual failure and did not prevent extensive damage to expensive equipment.

Systems according to the present disclosure allow a user to configure instrumentation and/or other equipment in an improved manner. In contrast to the above example cable strain relief devices, the present system allows the user to organize cables using a cable strain arrestor assembly. The cable strain arrestor assembly not only provides strain relief for expensive equipment, but also prevents pulling forces through cable tension from being transferred to the instrumentation. Rather, the present system shifts damaging forces from both the equipment and assembly to the cables at the point of connection. In this way, the structural integrity of the cable strain arrestor assembly is never compromised at any force magnitude. Instead, the present system sacrifices the expendable cables so that both the expensive equipment and the cable strain arrestor assembly itself remain unharmed.

Additionally, the presently described system may provide improved safety for users by preventing fingers and other small objects from accessing the interior of the instrumentation container. This can prevent electric shock and damage to others as well as protect the equipment. Blocking the entry of external materials, such as dust and debris, allows the cable strain arrestor assembly to be used in conjunction with other protective enclosures without compromising the secure interior environment of the equipment.

Further, the presently described system incorporates simple management and organization of the cables into its design. The precise and consistent grouping of cables in the cable strain arrestor assembly allows the user to order the cables in a kempt matter according to the user's custom equipment setup without having to utilize excess length of cables. The arrangement of cables in the cable strain arrestor assembly avoids cluttering, tangling, or knotting of cables, enclosures, or equipment. In addition, the presently described system facilitates both unfettered airflow and ease of access. Users may also make changes to the instrumentation or equipment setup relatively easily.

Figure 1:
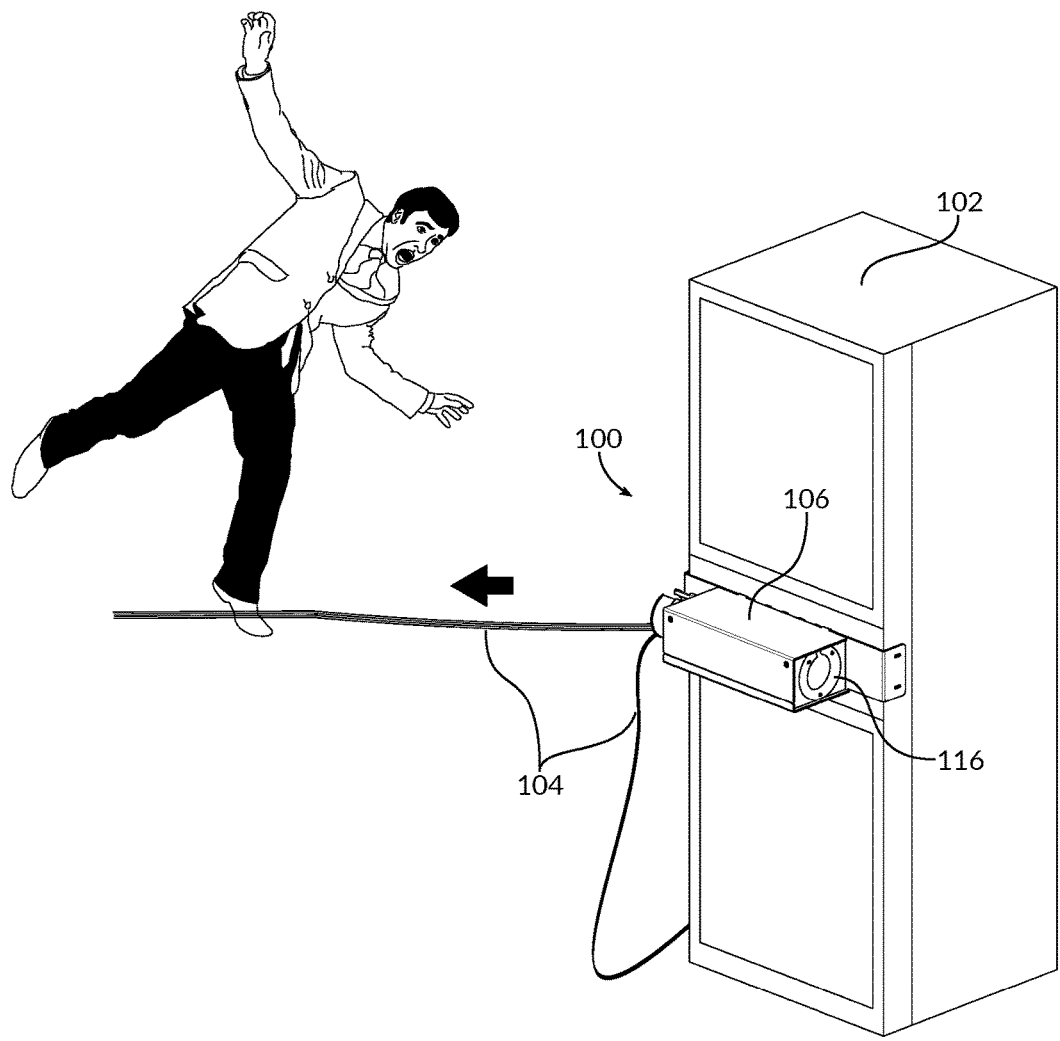
FIG. 1 is a depiction of an example system of test and measurement instrumentation in a rack cabinet with a cable strain arrestor assembly attached including an external force being applied to the cables, according to embodiments of the present disclosure.

A system of instrumentation 100, as seen in FIG. 1, may be in communication with various devices for collecting data from a system being tested or measured, unit under test (UUT), or device under test (DUT). The system 100 shown in FIG. 1 includes a rack cabinet 102 that contains equipment, such as a computer, server, digital multimeter (DMM), oscilloscope, and/or stand-alone data loggers, for example. The system 100 may be in communication with an internal or external bus, which provides one or more communication channels along which signals may travel. Cables 104 for interchanging signals and/or power may be connected to the instruments within the rack cabinet 102. The cables 104 connected to the instrumentation inside the rack cabinet 102 are arranged in a cable strain arrestor assembly 106. The cable strain arrestor assembly 106 protects the instrumentation inside the rack cabinet 102 from damage that could be imparted by external pulling forces on the cables 104. The forces applied to the cables 104 could be from any source such as a person pulling or tripping over the cables 104, attached devices falling or dismounting, and/or impacts due to earthquakes or explosions, for example.

The cable strain arrestor assembly 106 may be attached to a rack cabinet 102 as shown in FIG. 1, although it could also be attached to the rack cabinet 102 in other ways. The rack cabinet 102 may be a standard 19 inch width rack, such as those used for storing servers and/or test and measurement instrumentation. The rack cabinet 102 may have a height of 37 U, for example. The cable strain arrestor assembly 106 may attach to the rack cabinet 102 using a standard rack rail. Additionally or alternatively, the rack cabinet 102 may include a specific section and/or location for attaching the cable strain arrestor assembly 106. As another alternative, the design of the rack cabinet 102 may integrate the cable strain arrestor assembly 106 into the rack cabinet 102 itself, rather than the cable strain arrestor assembly 106 being a separate attachment for the rack cabinet 102. Moreover, the cable strain arrestor assembly 106 may be equipped with adjustable and/or modular mounting devices that allow the cable strain arrestor assembly 106 to be attached to any type of equipment shelves or housings. The connection between the cable strain arrestor assembly 106 and the rack cabinet 102, equipment enclosure, or other anchor should be stronger than the tensile strength of the cables 104. Further, the rack cabinet 102 should be sufficiently weighted and/or anchored to the floor or wall to prevent overturning. The mass, center of mass, and additional anchoring of the rack cabinet 102 may be accounted for when determining where to attach the cable strain arrestor assembly 106. Although illustrated in FIG. 1 as being mounted near the center of the rack cabinet 102, the cable strain arrestor assembly 106 may be installed at any height.

Figure 2:
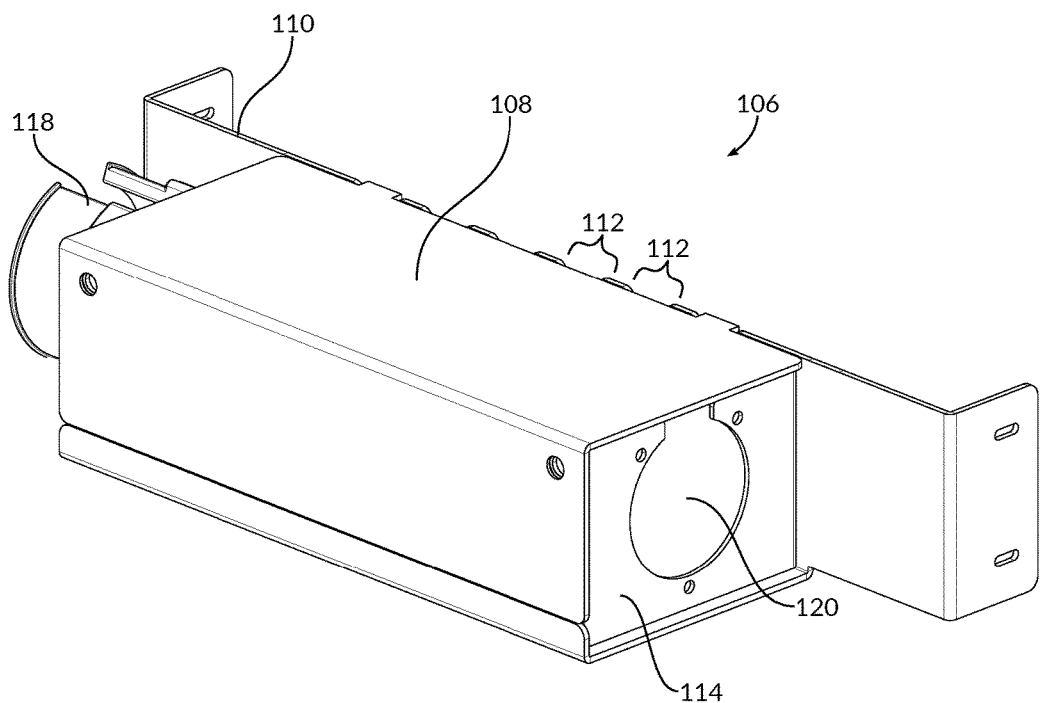
FIG. 2 is an isometric view of an example cable strain arrestor assembly including a mounting bracket, cover, slots, and flange brackets, according to embodiments of the present disclosure.

As seen in FIG. 2, the cable strain arrestor assembly 106 includes a cover 108, a mounting bracket 110 with slots 112, and side flange brackets 114. The side flange brackets 114 may have rounded wire grommets 116 (seen in FIG. 1) attached to protect the cables 104 from any sharp edges on the side flange brackets 114. The side flange brackets 114 may each have a flange 118 for supporting and/or guiding the cables 104. Alternatively, the cables 104 may extend through just one side flange bracket 114. In this case, the side flange bracket 114 without any cables 104 may include a side cover 120. The side cover 120 helps to seal the cable strain arrestor assembly 106 and the rack cabinet 102 from external dust and debris.

Figure 3:
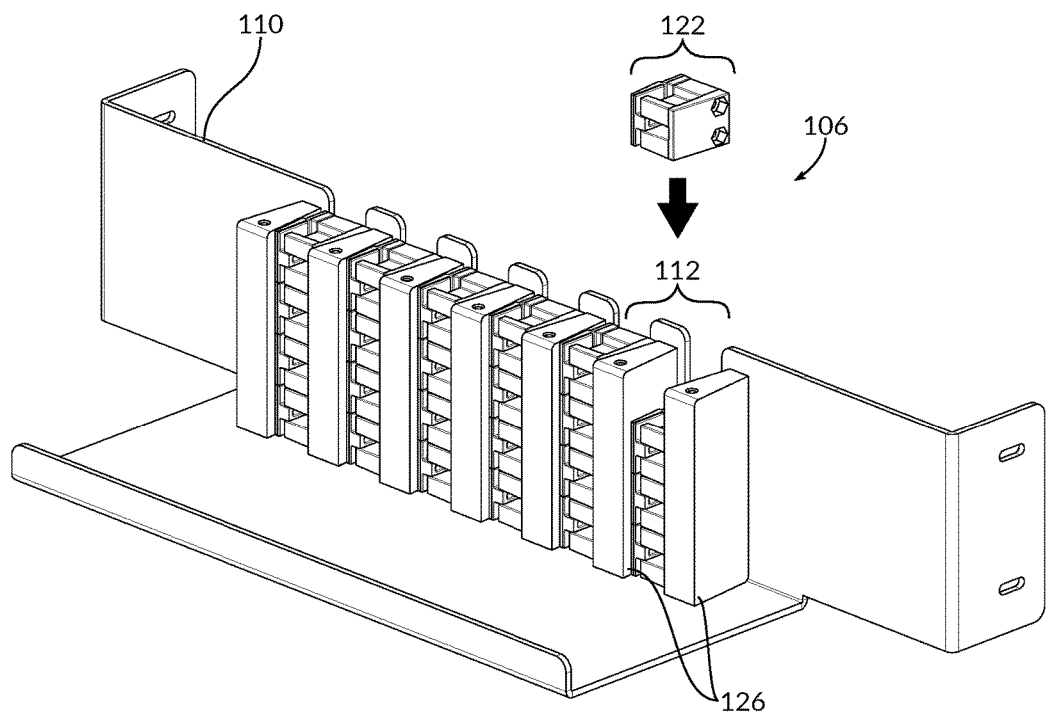
FIG. 3 is an isometric view of an example cable strain arrestor assembly including a mounting bracket, wedges, and twenty-four clamping collars with one being inserted into a slot between the wedges, according to embodiments of the present disclosure.

FIG. 3 shows the mounting bracket 110 of the cable strain arrestor assembly 106 with the cover 108 and other parts removed. The slots 112 of the cable strain arrestor assembly 106 are tapered. As seen in FIG. 3, the tapering of the slots 112 is provided by one or more separate tapered wedges 126 that can be removably fastened to the mounting bracket 110. In this way, the particular angle of tapering of some slots 112 may be altered by interchanging the wedges 126 having the desired angle. Alternatively, the tapering slots 112 may be integrally formed with the mounting bracket 110. In addition, any slots 112 integrally formed as part of the mounting bracket 110 may alter their tapering angle by the addition of thinner wedge inserts within the slots 112. In some embodiments, only one of the wedges 126 forming a slot 112 is angled to form the tapered slot.

Stacked in the tapering slots 112 between the wedges 126 are one or more clamping collars 122 that engage with the mounting bracket 110. The clamping collars 122 are shaped to interfere with the one of the tapering slots 112 into which an individual clamping collar 122 is inserted. Because of their complementary shape, the clamping collars 122 can slide into the tapering slots 112 from above, in a top-loaded magazine fashion, as shown in FIG. 3. Of course, other methods of loading clamping collars 122 into corresponding slots 112 may also be utilized, such as inserting one or more wedges after the clamping collars 122 are loaded.

Figure 4:
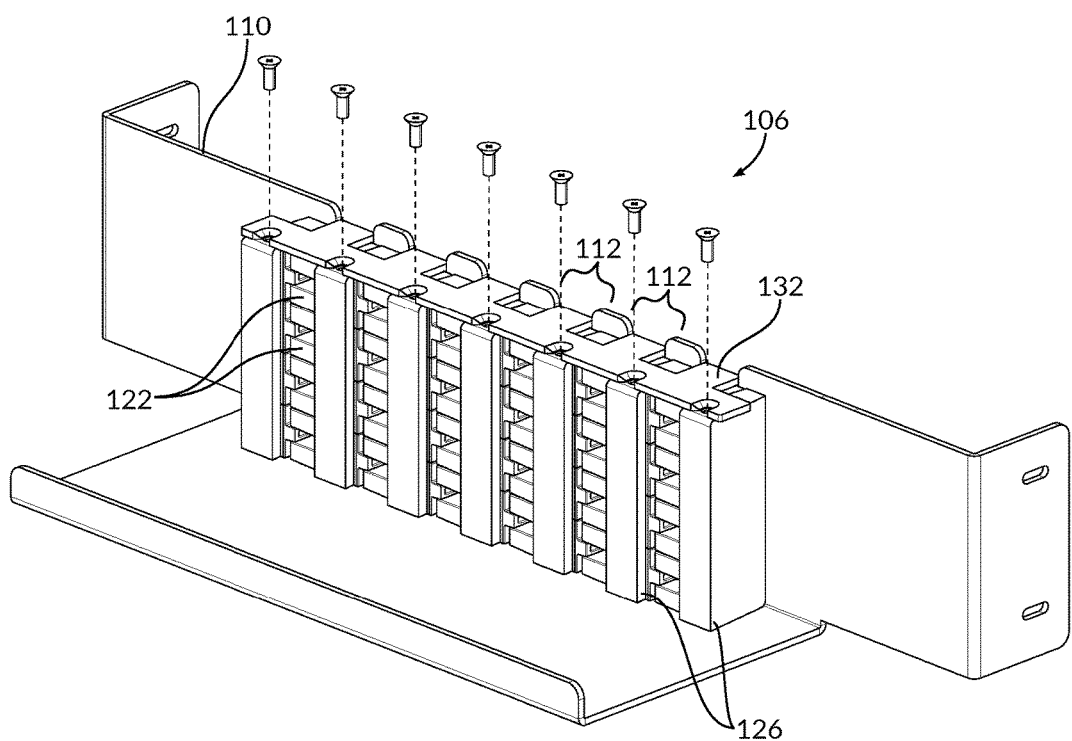
FIG. 4 is an isometric view of the example cable strain arrestor assembly of FIG. 3, including a collar brace, according to embodiments of the present disclosure.

Once all the clamping collars 122 are slid into the tapering slots 112 of the cable strain arrestor assembly 106, a collar brace 132 may be fastened to the wedges 126 over the slots 112 to secure the clamping collars 122 in place, as shown in FIG. 4. In the embodiment shown, the mounting bracket 110 includes six slots 112, where four clamping collars 122 may be stacked in each slot. Alternatively, the cable strain arrestor assembly 106 may include any number of tapering slots 112 and clamping collars 122, such as one slot 112 that fits one or more clamping collars 122, for example.

Figure 5:
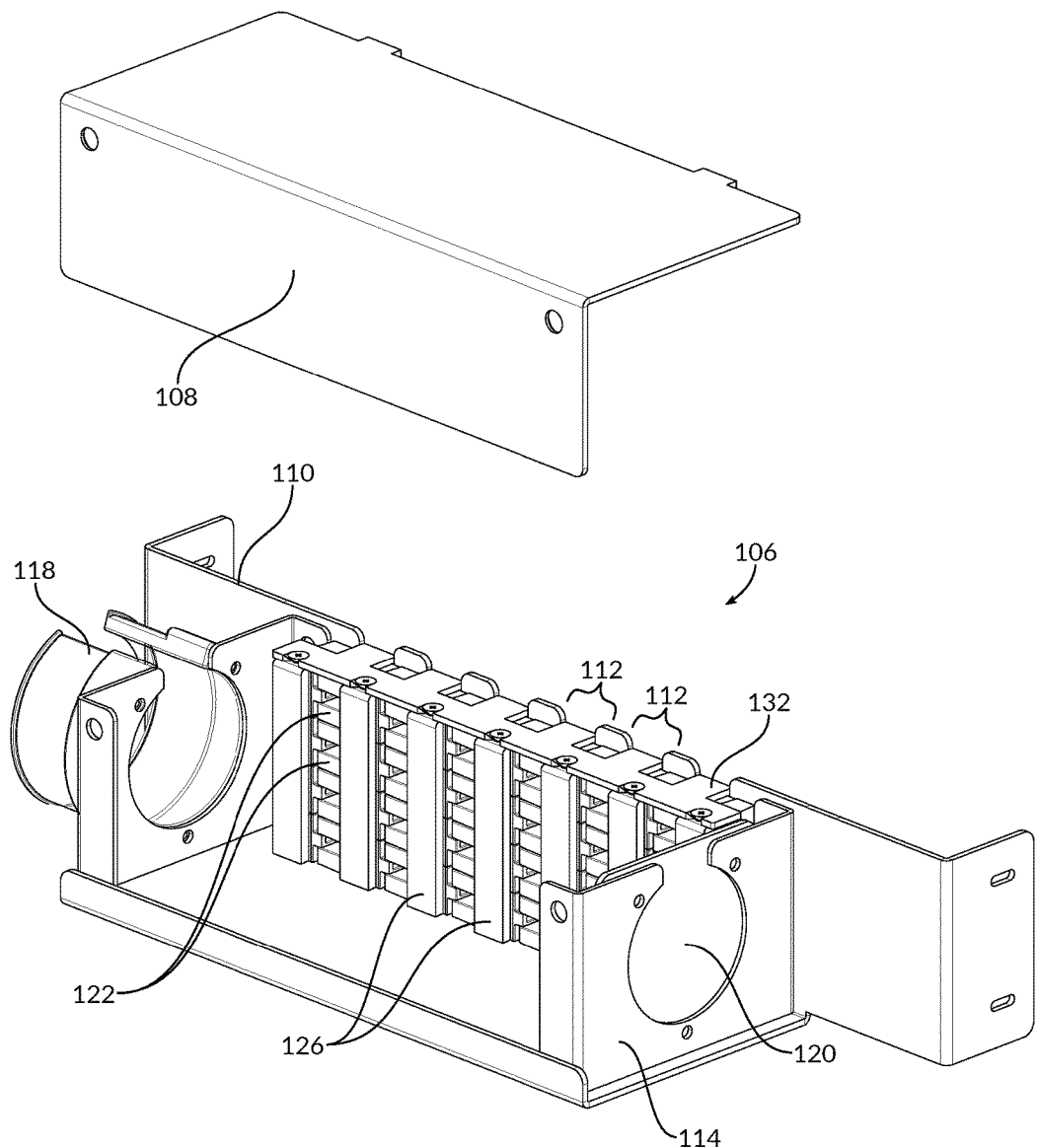
FIG. 5 is an isometric view of the example cable strain arrestor assembly of FIGS. 3-4, including flange brackets and showing a cover being added, according to embodiments of the present disclosure.

As shown in FIG. 5, once the clamping collars 122 are secured, the cover 108 may be attached to the cable strain arrestor assembly 106 to prevent tampering. The cover may also provide a cleaner look for the entire system 100, including the rack cabinet 102 and the cable strain arrestor assembly 106. Alternatively, even without the cover 108 on the cable strain arrestor assembly 106, the neat stacking of the clamping collars 122 in the tapering slots 112 may prevent the intrusion of external objects into the rack cabinet 102. For example, even if all the clamping collars 122 do not contain cables 104, the empty clamping collars 122 may still be included in the cable strain arrestor assembly 106 to provide more security for the rack cabinet 102 and/or to store the additional clamping collars 122.

As described in detail below, the clamping collars 122 may fasten around one or more cables 104 and may be initially tightened to place a friction hold on the cables 104. Then, when the cables 104 are pulled away from the rack cabinet 102, the clamping collars 122 further engage with the tapering slots 112 of the mounting bracket 110 in such a way that the clamping collars 122 physically contract around the cables 104 as a function of the pulling force combined with the tapering slots 112. In this way, the cable strain arrestor assembly 106 does not allow pulling forces on the cables 104 to be transferred to the instrumentation inside the rack cabinet 102. Rather, the pulling forces are converted into contracting or compressing forces on the cables 104, thereby preventing slippage of the cables 104 relative to the cable strain arrestor assembly 106. If the pulling forces on the cables 104 exceed a certain threshold, the contracting forces of the clamping collars 122 on the cables 104 combined with the tension force on the cables 104 themselves will cause the cables 104 to be damaged and eventually break. Because of the relative low cost of cables 104 compared to the cost of test and measurement instrumentation, it is preferable that any damage imparted by external forces be limited to the cables 104 and prevented from transferring to any expensive equipment contained within the rack cabinet 102.

Figure 6:
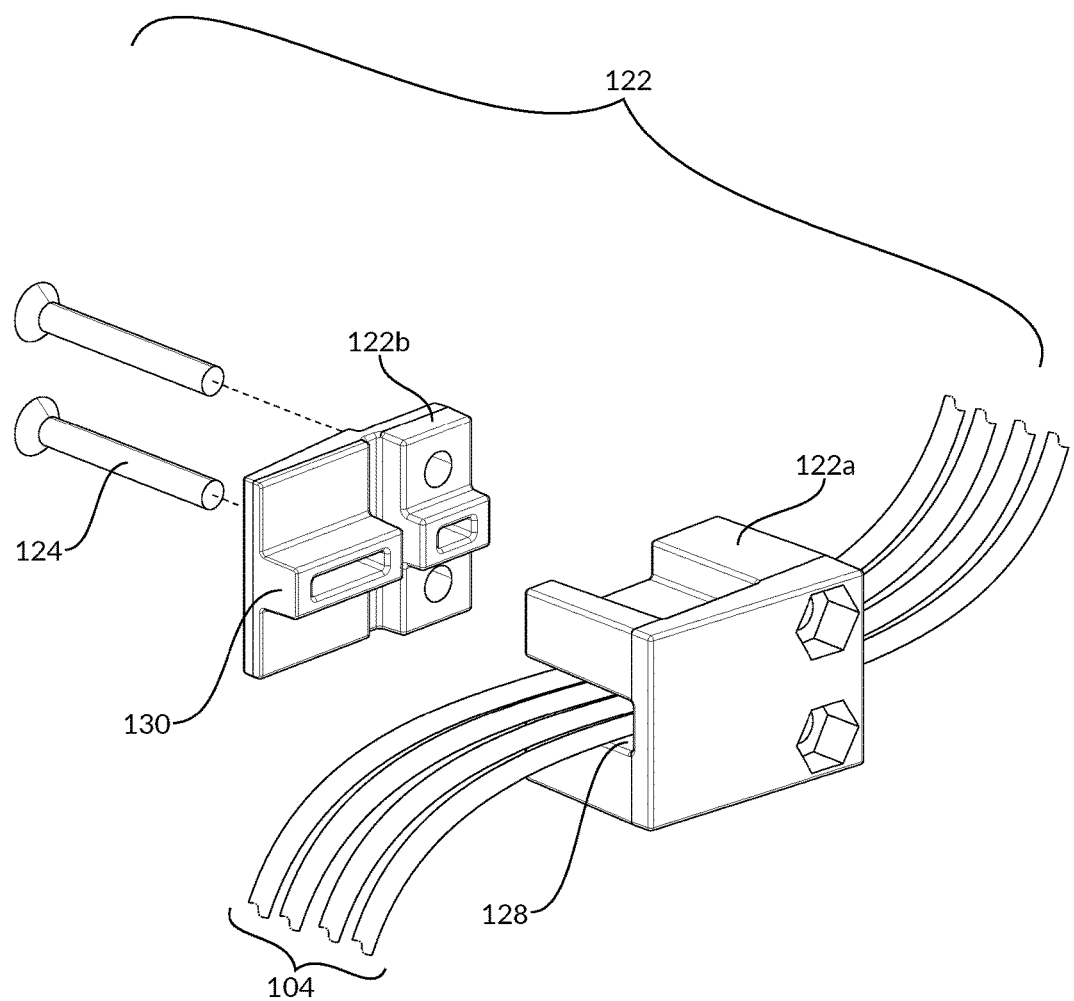
FIG. 6 is an isometric view of an example clamping collar being fastened around a group of cables, according to embodiments of the present disclosure.

As shown in FIG. 6, the clamping collars 122 may include a channel piece, part, or portion 122a and a protrusion portion 122b that fit together and may be secured to one another using one or more fasteners 124. The clamping collar 122 includes an indentation, trough, or channel 128 where one or more cables 104 may be arranged. The protrusion portion 122*b* may include a projection, ridge, or further protrusion 130 that may be at least partially inserted into the channel 128 of the channel portion 122*a*. The interaction of the protrusion 130 with the channel 128 provides the contracting forces of the clamping collar 122 on the cables 104. The fastener 124 may be a threaded screw, for example, and the channel portion 122*a* may include threading along an internal bore or within an aperture. Other methods of assembling the clamping collar 122 are possible as well.

Figure 7A:
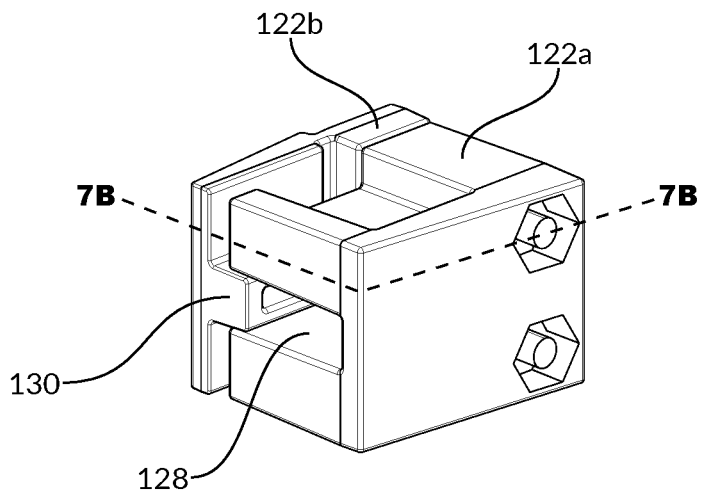
FIG. 7A is an isometric view of the example clamping collar of FIG. 6 once fastened together, according to embodiments of the present disclosure.
Figure 7B:
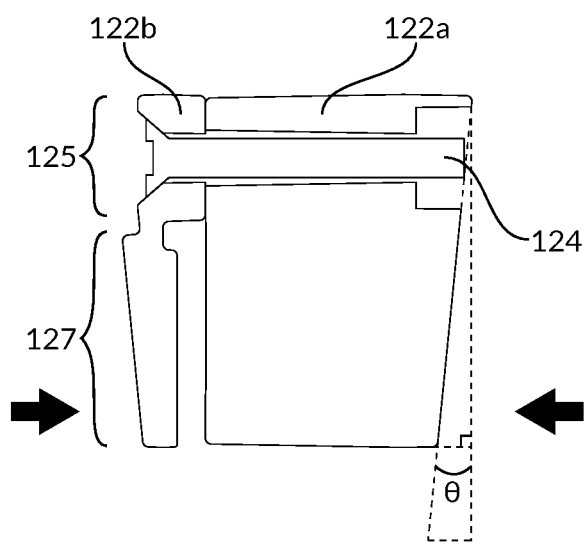
FIG. 7B is cross-sectional view of the example clamping collar of FIG. 7A, according to embodiments of the present disclosure.

FIG. 7A shows the channel portion 122*a* fastened to the protrusion portion 122*b* by the fasteners 124 to form the assembled clamping collar 122. FIG. 7B shows a cross-sectional view of the clamping collar 122 at the transverse section indicated by the dashed line labelled 7B in FIG. 7A. As seen in FIG. 7B, in the region of the clamping collar 122 near the fastener 124, the protrusion portion 122*b* directly abuts the channel portion 122*a* in a fixed portion or abutting region 125. This abutting region 125 of the clamping collar 122 is located toward the wider end of the tapering slot 112 (see FIG. 3), closest to the instrumentation within the rack cabinet 102 (see FIG. 1), when placed in the cable strain arrestor assembly 106 attached to the rack cabinet 102. Outside of the abutting region 125 of the clamping collar 122, the protrusion portion 122*b* is flexible and allowed to move relative to the channel portion 122*a*. Thus, when this movable portion or freely moving region 127 of the clamping collar 122 is subjected to contracting forces caused by the clamping collar 122 moving toward the narrower end of the tapering slot 112, the protrusion 130 is caused to be forced further into the channel 128, providing an increased clamping force on the cables 104.

Figure 8:
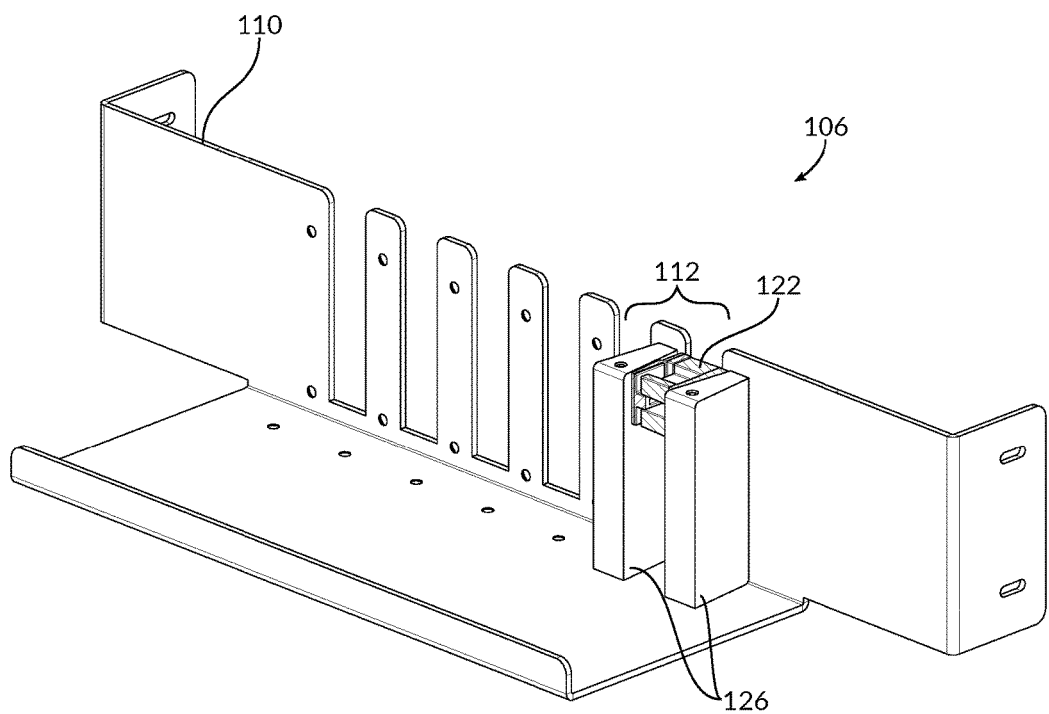
FIG. 8 is an isometric view of an example cable strain arrestor assembly including a mounting bracket, wedges, and a clamping collar, according to embodiments of the present disclosure.
Figure 9:
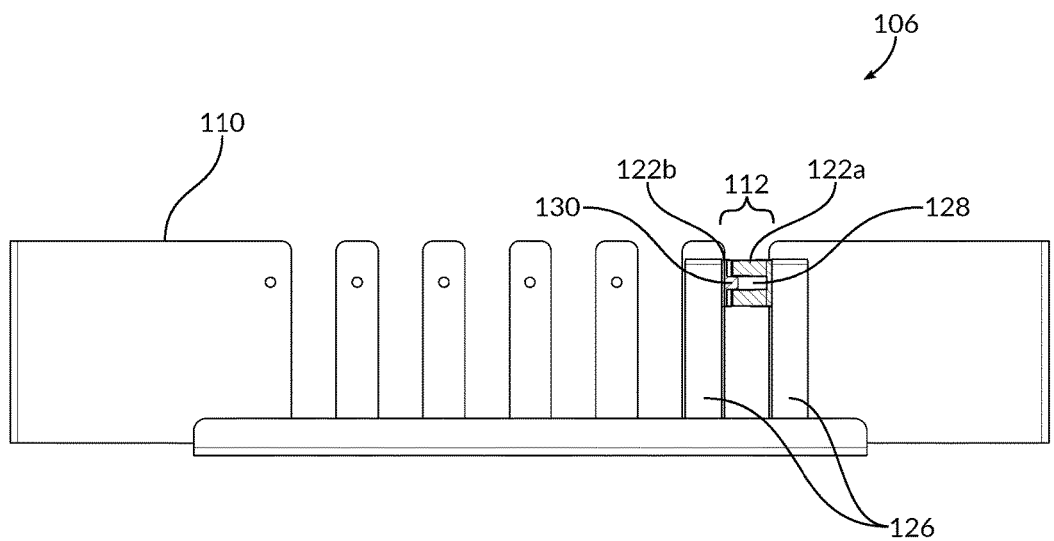
FIG. 9 is a side view of the example cable strain arrestor assembly of FIGS. 3-4, according to embodiments of the present disclosure.
Figure 10:
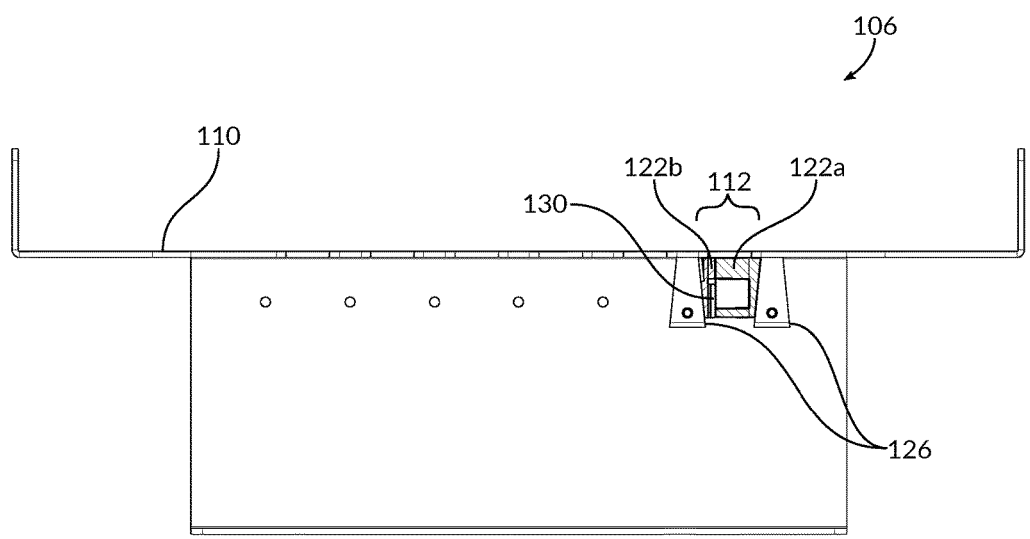
FIG. 10 is a top plan view of the example cable strain arrestor assembly of FIGS. 3-4, according to embodiments of the present disclosure.

FIGS. 8-10 show isometric, side, and top plan views, respectively, of a single clamping collar 122 in a tapering slot 112 of the cable strain arrestor assembly 106. As can be seen in FIGS. 8-10, when any cables 104 in the channel 128 of the clamping collar 122 are pulled away from the equipment rack 102, the initial tight friction hold of the clamping collar 122 around the cables 104, held in place by the fasteners 124, will cause the entire clamping collar 122 to move relative to the wedges 126 in the direction of the narrowing taper of the slot 112, i.e., in the direction of the pulling force on the cables 104. Because of the interaction between the freely moving region 127 of the clamping collar 122 and the tapering slot 112 of the cable strain arrestor assembly 106, as the clamping collar 122 moves in the direction of the narrowing taper of the slot 112, the reduction in width of the slot 112 causes the wedges 126 to impart a contracting force on the clamping collar 122 in its freely moving region 127. As discussed above, when a contracting force is applied to the freely moving region 127 of the clamping collar 122, the protrusion portion 122*b* will move relative to the channel portion 122*a* along the freely moving region 127 about a pivot point formed in the protrusion portion 122*b* near the fastener 124. This pivot point is generated by the vertically aligned troughs (as shown looking in the vertical direction from above in FIG. 10) in the protrusion portion 122*b* that form the thinnest region of the protrusion portion 122*b*, as best seen in FIG. 7B. The relative flexibility of the material of the protrusion portion 122*b* in this relatively thin region between the abutting region 125 and the freely moving region 127 is due to its lower material strength compared to the thicker regions. Whenever the protrusion portion 122*b* moves relative to the channel portion 122*a* within the clamping collar 122, the corresponding protrusion 130 (see FIG. 6) further penetrates the channel 128 reducing the volume of the channel 128. The reduction of the volume of the channel 128 is more pronounced near the freely moving region 127 of the clamping collar 122 rather than the abutting region 125, which remains relatively fixed. The penetration of the channel 128 by the protrusion 130 thereby diminishes the cross-sectional capacity of the clamping collar 122 for the cables 104 and applies compressing and/or shearing stresses onto the cables 104 at the narrowest point and along the freely moving region 127. Thus, the contracting force of the clamping collar 122, induced by the pulling force on the cables 104, is applied to the cables 104 themselves, and this conversion of forces effectively stops any non-negligible pulling forces from being transferred through to the ends of the cables 104, and further to the expensive equipment or instruments within the system 100 that are inside the rack cabinet 102.

No damaging pulling forces are transferrable through the cables 104 to the instrumentation inside the rack cabinet 102 because the compression applied to the cables 104 would break the cables 104 long before the cable strain arrestor assembly 106 would detach from the rack cabinet 102. Moreover, because of the relative sizes of the slot 112 and the clamping collar 122, the clamping collar 122 would not be squeezable through the tapered end of the slot 112 in the mounting bracket 110, even if broken, due to the incompressibility of the materials. Because of this barrier, the clamping collars 122, with respect to the direction of narrowing taper of the slot 112, are effectively fastened to the mounting bracket 110 in the same way as the wedges 126, while remaining free to be rearranged with relative ease in other directions.

As shown in FIG. 7B, a pitch or angle θ of the tapering slot 112, wedges 126, and/or complementary clamping collars 122 may be based on the size and type of cables 104 being used. For example, the angle θ of the wedge 126 and the clamping collar 122 may be proportional to the frictional coefficients between the clamping collar 122 and the tapering slot 112 and between the cables 104 and the clamping collar 122, according to the following Formula (1):

$$k_1 = \frac{k_2 \cos\theta - \sin\theta}{k_2 \sin\theta + \cos\theta} \quad (1)$$

where $k_1$ is the coefficient of friction between the clamping collar 122 and the tapering slot 112, and $k_2$ is the coefficient of friction between the cables 104 and the clamping collar 122. Further, the relationship between $k_1$ and $k_2$ can be represented as shown in Formula (2):

$$k_1 < k_2 \quad (2)$$

so that as θ increases and $k_1$ is held at a theoretical minimum of 0, the acceptable $k_2$ values increase accordingly.

Additionally, if the number of cables 104 inserted into the channel 128 are too few to completely fill the channel 128 for a tight initial friction hold by the clamping collar 122, spacers (not shown) may be added. The spacers are arranged in the channel 128 along with the cables 104 at the time of fastening the clamping collar 122 around one or more cables 104. In this way, the spacers compensate for any gap that might otherwise have remained in the channel 128 due to the relatively small size of having only one or a few cables 104 in the channel 128, and the cable strain arrestor assembly 106 may then operate the same as it would with a greater number of cables 104.

The aspects of the present disclosure are susceptible to various modifications and alternative forms. Specific aspects have been shown by way of example in the drawings and are described in detail herein. However, it should be noted that the examples disclosed herein are presented for the purposes of clarity of discussion and are not intended to limit the scope of the general concepts disclosed to the specific aspects described herein unless expressly limited.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 includes a cable strain arrestor assembly for equipment installed in an equipment rack, the assembly comprising: a mounting bracket coupled to the equipment rack, the mounting bracket including a tapered slot having a wide end and a narrow end; and a clamping collar structured to be inserted into the tapered slot and being slideable therein, the clamping collar including: a fixed portion disposed toward the wide end of the tapered slot when the clamping collar is inserted into the slot, a movable portion disposed toward the narrow end of the tapered slot when the clamping collar is inserted into the slot, and a variable-sized cable channel structured to accept one or more cables therethrough for attaching to the installed equipment, the cable channel having a fixed portion adjacent the fixed portion of the clamping collar and having a variable-sized portion adjacent the movable portion of the clamping collar, in which a cross-sectional area of the variable sized portion of the cable channel reduces as the clamping collar is moved toward the narrow end of the slot.

Example 2 includes aspects of example 1, further comprising multiple clamping collars stackable on each other within the tapered slot.

Example 3 includes aspects of example 1, in which the mounting bracket comprises multiple tapered slots.

Example 4 includes aspects of example 1, in which the clamping collar includes a fastener for securing the one or more cables within the cable channel.

Example 5 includes aspects of example 1, in which the taper of the slot is variable.

Example 6 includes aspects of examples 1 and 5, in which the taper of the slot is selected based on a type of the one or more cables.

Example 7 includes aspects of examples 1 and 5, in which the tapered slot comprises one or more wedges interchangeably connectable to the mounting bracket.

Example 8 includes aspects of examples 1, 5, and 7, in which at least one side of the clamping collar has a sloped shape that matches a slope of the one or more wedges of the tapered slot.

Example 9 includes a cable strain arrestor assembly for equipment installed in an equipment rack, the assembly comprising: a mounting bracket coupled to the equipment rack, the mounting bracket including at least one tapered slot having a wide end and a narrow end; and a two-piece clamping collar that, when assembled together includes a variable-sized cable channel therein, the clamping collar structured to interfere with the tapered slot to cause the clamping collar to reduce a volume in a portion of the cable channel when the clamping collar is moved toward the narrow end of the tapered slot.

Example 10 includes aspects of example 9, in which the clamping collar has an angled shape that matches an angle of the tapered slot.

Example 11 includes aspects of example 9, in which one piece of the two-piece clamping collar is flexible and is structured to move relative to the other piece of the two-piece clamping collar when the clamping collar is moved toward the narrow end of the tapered slot.

Example 12 includes aspects of example 9, in which the variable-sized cable channel includes a first, fixed-sized end and a second, variable-sized end.

Example 13 includes a method for securing cables connected to equipment in a rack cabinet, the rack including a mounting bracket having a tapered slot, the method comprising: inserting at least one cable extending from the rack cabinet into a cable channel formed in a clamping collar to establish a friction hold, the cable channel including a flexible portion and a fixed portion and the cable channel structured to reduce a cross-sectional area in the flexible portion when the clamping collar moves toward a narrow end of the tapered slot; and inserting the clamping collar into the tapered slot with the flexible portion oriented toward the narrow end of the slot.

Example 14 includes aspects of example 13, further comprising: measuring a length of cable from an instrument in the rack cabinet to the wedges; and fastening the clamping collar near the length measured.

Example 15 includes aspects of example 13, further comprising: breaking the at least one cable with the cable channel of the clamping collar when the at least one cable and clamping collar are pulled to a certain position within the tapered slot.

Example 16 includes aspects of example 13, in which a shape of the clamping collar matches an angle of the tapered slot.

Example 17 includes aspects of example 13, further comprising inserting a plurality of clamping collars into the tapered slot.

Example 18 includes aspects of example 13, further comprising securing the clamping collar in the tapered slot of the mounting bracket.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the invention have been illustrated and described for purposes of illustration, it will be understood that various modifications may be made without departing from the spirit and scope of the invention. Accordingly, the invention should not be limited except as by the appended claims.

What is claimed is:

1. A cable strain arrestor assembly for equipment installed in an equipment rack, the assembly comprising:
   a mounting bracket coupled to the equipment rack, the mounting bracket including a tapered slot having a wide end and a narrow end; and
   a clamping collar structured to be inserted into the tapered slot and being slideable therein, the clamping collar including:
      a fixed portion disposed toward the wide end of the tapered slot when the clamping collar is inserted into the slot,
      a movable portion disposed toward the narrow end of the tapered slot when the clamping collar is inserted into the slot, and
      a variable-sized cable channel structured to accept one or more cables therethrough for attaching to the installed equipment, the cable channel having a fixed portion adjacent the fixed portion of the clamping collar and having a variable-sized portion adjacent the movable portion of the clamping collar, in which a cross-sectional area of the variable-sized portion of the cable channel reduces as the clamping collar is moved toward the narrow end of the slot.

2. The assembly of claim 1, further comprising multiple clamping collars stackable on each other within the tapered slot.

3. The assembly of claim 1, in which the mounting bracket comprises multiple tapered slots.

4. The assembly of claim 1, in which the clamping collar includes a fastener for securing the one or more cables within the cable channel.

5. The assembly of claim 1, in which the taper of the slot is variable.

6. The assembly of claim 5, in which the taper of the slot is selected based on a type of the one or more cables.

7. The assembly of claim 5, in which the tapered slot comprises one or more wedges interchangeably connectable to the mounting bracket.

8. The assembly of claim 7, in which at least one side of the clamping collar has a sloped shape that matches a slope of the one or more wedges of the tapered slot.

9. A cable strain arrestor assembly for equipment installed in an equipment rack, the assembly comprising:
   a mounting bracket coupled to the equipment rack, the mounting bracket including at least one tapered slot having a wide end and a narrow end; and
   a two-piece clamping collar that, when assembled together includes a variable-sized cable channel therein, the clamping collar structured to interfere with the tapered slot to cause the clamping collar to reduce a volume in a portion of the cable channel when the clamping collar is moved toward the narrow end of the tapered slot.

10. The cable strain arrestor assembly of claim 9, in which the clamping collar has an angled shape that matches an angle of the tapered slot.

11. The cable strain arrestor assembly of claim 9, in which one piece of the two-piece clamping collar is flexible and is structured to move relative to the other piece of the two-piece clamping collar when the clamping collar is moved toward the narrow end of the tapered slot.

12. The cable strain arrestor assembly of claim 9, in which the variable-sized cable channel includes a first, fixed-sized end and a second, variable-sized end.

13. A method for securing cables connected to equipment in a rack cabinet, the rack including a mounting bracket having a tapered slot, the method comprising:
   inserting at least one cable extending from the rack cabinet into a cable channel formed in a clamping collar to establish a friction hold, the cable channel including a flexible portion and a fixed portion and the cable channel structured to reduce a cross-sectional area in the flexible portion when the clamping collar moves toward a narrow end of the tapered slot; and
   inserting the clamping collar into the tapered slot with the flexible portion oriented toward the narrow end of the slot.

14. The method of claim 13, further comprising:
   measuring a length of cable from an instrument in the rack cabinet to the wedges; and
   fastening the clamping collar near the length measured.

15. The method of claim 13, further comprising:
   breaking the at least one cable with the cable channel of the clamping collar when the at least one cable and clamping collar are pulled to a certain position within the tapered slot.

16. The method of claim 13, in which a shape of the clamping collar matches an angle of the tapered slot.

17. The method of claim 13, further comprising inserting a plurality of clamping collars into the tapered slot.

18. The method of claim 13, further comprising securing the clamping collar in the tapered slot of the mounting bracket.

* * * * *